(12) United States Patent
Ho et al.

(10) Patent No.: US 10,960,583 B2
(45) Date of Patent: Mar. 30, 2021

(54) MOLDING SYSTEM FOR APPLYING A UNIFORM CLAMPING PRESSURE ONTO A SUBSTRATE

(71) Applicant: ASM Technology Singapore Pte Ltd, Singapore (SG)

(72) Inventors: Shu Chuen Ho, Singapore (SG); Choon Hong Cheong, Singapore (SG); Chin Guan Ong, Singapore (SG); Kai Wu, Singapore (SG); Teng Hock Kuah, Singapore (SG); Ji Yuan Hao, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 249 days.

(21) Appl. No.: 15/213,576

(22) Filed: Jul. 19, 2016

(65) Prior Publication Data
US 2018/0021993 A1 Jan. 25, 2018

(51) Int. Cl.
| | | |
|---|---|---|
| B29C 45/14 | (2006.01) | |
| B29C 45/02 | (2006.01) | |
| B29C 45/76 | (2006.01) | |
| H01L 21/67 | (2006.01) | |
| B29C 33/12 | (2006.01) | |

(Continued)

(52) U.S. Cl.
CPC ...... B29C 45/14065 (2013.01); B29C 33/123 (2013.01); B29C 45/02 (2013.01);
(Continued)

(58) Field of Classification Search
CPC . B29C 45/14065; B29C 33/123; B29C 45/02; B29C 45/03; B29C 45/14655;
(Continued)

(56) References Cited

U.S. PATENT DOCUMENTS

| | | | |
|---|---|---|---|
| 3,909,175 A | 9/1975 | Gemmill | 425/242 |
| 6,869,556 B2 | 3/2005 | Ho | 264/272.17 |

(Continued)

FOREIGN PATENT DOCUMENTS

| | | |
|---|---|---|
| JP | 2008-87408 | 4/2008 |
| KR | 10-2007-0092634 | 9/2007 |

(Continued)

OTHER PUBLICATIONS

Philippines Written Opinion and Search Report, dated Oct. 13, 2017, issued in corresponding Philippines Patent Application No. 1/2017/000208. Total 10 pages.

(Continued)

*Primary Examiner* — Michael M. Robinson
(74) *Attorney, Agent, or Firm* — Ostrolenk Faber LLP

(57) ABSTRACT

A molding system for encapsulating electronic devices mounted on a substrate, the molding system comprising a first mold chase with a first mold chase surface and a second mold chase with a second mold chase surface opposite to the first mold chase surface, the first and second mold chase surfaces being operative to clamp onto the substrate and to apply a clamping pressure thereto. The molding system further comprises a first sensor located at a first position for determining a first relative distance between the substrate and a mold chase facing the substrate at the first position, and a second sensor located at a second position for determining a second relative distance between the substrate and a mold chase facing the substrate at the second position. The molding system also comprises a first actuator located adjacent to the first position and a second actuator located adjacent to the second position, wherein the first and second actuators are operative to adjust the first relative distance with respect to the second relative distance for applying a uniform clamping pressure onto the substrate.

13 Claims, 5 Drawing Sheets

(51) Int. Cl.
    *B29C 45/03*     (2006.01)
    *B29L 31/34*     (2006.01)

(52) U.S. Cl.
    CPC ........ *B29C 45/03* (2013.01); *B29C 45/14655* (2013.01); *B29C 45/14819* (2013.01); *B29C 45/76* (2013.01); *B29C 45/7653* (2013.01); *H01L 21/67126* (2013.01); *B29C 2945/76096* (2013.01); *B29C 2945/76294* (2013.01); *B29C 2945/76387* (2013.01); *B29C 2945/76568* (2013.01); *B29L 2031/3481* (2013.01)

(58) Field of Classification Search
    CPC .............. B29C 45/14819; B29C 45/76; B29C 45/7653; B29C 2945/76096; B29C 2945/76294; B29C 2945/76387; B29C 2945/76568; H01L 21/67126; B29L 2031/3481
See application file for complete search history.

(56) References Cited

U.S. PATENT DOCUMENTS

| | | | |
|---|---|---|---|
| 6,875,384 B1 | 4/2005 | Whitney | 264/40.5 |
| 7,829,004 B2 | 11/2010 | Ho | 264/272.15 |
| 9,296,143 B2 | 3/2016 | Kashima | |
| 9,427,893 B2 | 8/2016 | Su et al. | |
| 2010/0013120 A1* | 1/2010 | Ho | B29C 45/02 264/272.11 |
| 2010/0090357 A1* | 4/2010 | Ho | B29C 45/2602 264/1.1 |
| 2012/0139144 A1* | 6/2012 | Tutmark | B29C 33/123 264/40.5 |
| 2012/0225241 A1* | 9/2012 | Kashima | B29C 45/0055 428/80 |

FOREIGN PATENT DOCUMENTS

| | | |
|---|---|---|
| TW | 201616619 A | 5/2016 |
| WO | WO 2016/088051 A1 | 6/2016 |

OTHER PUBLICATIONS

Office Action dated Feb. 26, 2018 issued in corresponding Taiwan Patent Application No. 106122619 without English translation.
Office Action dated Aug. 29, 2018 issued in corresponding Korean Patent Application No. 10-2017-0091043 with English translation.

* cited by examiner

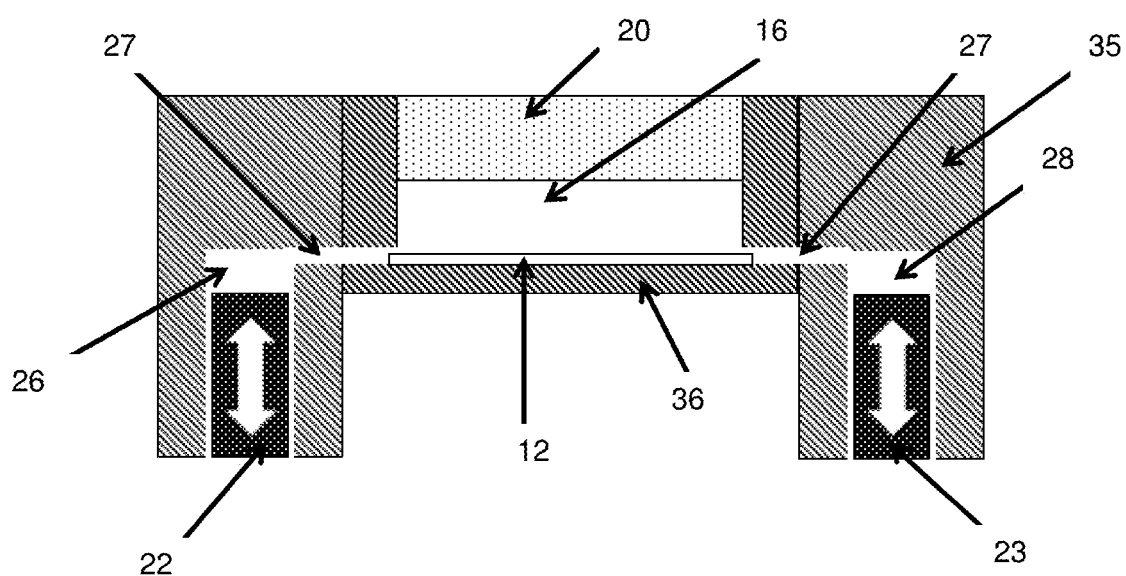
FIG. 1
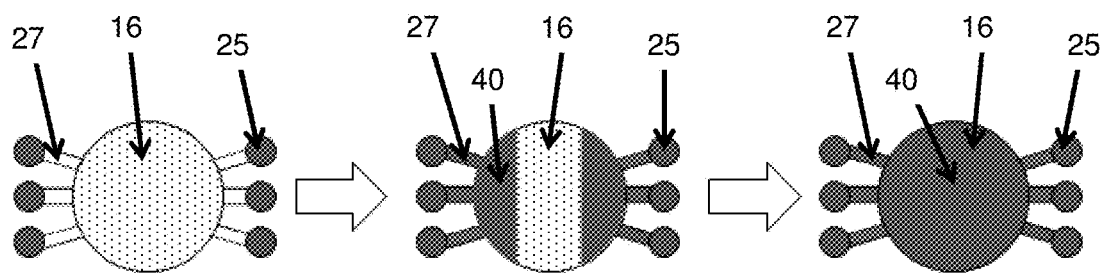
FIG. 2A     FIG. 2B     FIG. 2C

MOLDING SYSTEM FOR APPLYING A UNIFORM CLAMPING PRESSURE ONTO A SUBSTRATE

FIELD OF THE INVENTION

The invention relates to a molding system and in particular, to a molding system for encapsulating a semiconductor substrate.

BACKGROUND

Transfer molding is one of the more commonly employed methods for encapsulating semiconductor devices. In transfer molding, a molding compound in the form of a solid pellet is introduced into a mold supply pot of a molding system. The solid pellet molding compound is melted into a liquid state with the application of heat and pressure. The liquefied molding compound is then forced by a plunger into a runner connecting the mold supply pot to a molding cavity, in order to enter into the molding cavity via a gate. Thus, the molding compound covers a surface of a semiconductor substrate clamped in the molding cavity in order to encapsulate the semiconductor substrate.

The increasing demand for smaller semiconductor devices has led to a corresponding shrinkage of molding cavity height. This means that a surface of the semiconductor substrate is made increasingly closer to an opposing molding cavity surface, which then causes greater resistance to the flow of the liquefied molding compound into the molding cavity. As a result, there is a greater possibility that voids will arise in the resulting encapsulated semiconductor substrate.

Furthermore, when the semiconductor substrate to be encapsulated is a whole wafer, which is usually substantially larger than a lead frame, a wider molding cavity is required. In such cases, it is more difficult for the liquefied molding compound to properly fill the molding cavity. This is because the further the liquefied molding compound has to travel away from the gate, the more difficult it is for the ejected liquefied molding compound to properly fill the molding cavity.

In addition, the liquefied molding compound may overflow the molding cavity when the semiconductor substrate is improperly positioned, thus resulting in mold bleed. Furthermore, mold bleed may also occur in situations where the substrate thickness is uneven. In such situations, the surface of the semiconductor substrate would not be substantially parallel to the opposing molding cavity surface due to the uneven thickness of the semiconductor substrate. In other words, one portion of the molding cavity surface would be substantially nearer the surface of the semiconductor substrate than another portion of the molding cavity surface. As a result, the liquefied molding compound may overflow from the portion of the molding cavity where the molding cavity surface is substantially further away from the surface of the semiconductor substrate.

SUMMARY OF THE INVENTION

It is thus an object of this invention to seek to provide a molding system for encapsulating electronic devices mounted on a substrate, which overcomes at least some of the aforementioned problems of the prior art.

According to a first aspect of the invention, there is provided a molding system for encapsulating electronic devices mounted on a substrate, the molding system comprising: a first mold chase with a first mold chase surface and a second mold chase with a second mold chase surface opposite to the first mold chase surface, the first and second mold chase surfaces being operative to clamp onto the substrate and to apply a clamping pressure thereto; a first sensor located at a first position for determining a first relative distance between the substrate and a mold chase facing the substrate at the first position; a second sensor located at a second position for determining a second relative distance between the substrate and a mold chase facing the substrate at the second position; and a first actuator located adjacent to the first position and a second actuator located adjacent to the second position, wherein the first and second actuators are operative to adjust the first relative distance with respect to the second relative distance for applying a uniform clamping pressure onto the substrate.

According to a second aspect of the invention, there is provided a method for encapsulating electronic devices mounted on a substrate, the method comprising the steps of: clamping onto and applying a clamping pressure to the substrate with a first mold chase surface of a first mold chase and a second mold chase surface of a second mold chase that is opposite to the first mold chase surface; determining a first relative distance between the substrate and a mold chase facing the substrate with a first sensor located at a first position; determining a second relative distance between the substrate and the mold chase facing the substrate with a second sensor located at a second position; adjusting the first relative distance with respect to the second relative distance with a first actuator located adjacent to the first position and a second actuator located adjacent to the second position; and thereafter introducing liquefied molding compound onto the substrate to encapsulate the electronic devices.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which:

FIG. 1 is a schematic sectional view of a molding system according to the preferred embodiment of the invention;

FIGS. 2A-2C are schematic plan views of the molding cavity and a plurality of mold supply pots, showing the progress of the flow of the liquefied molding compound during encapsulation;

In the drawings, like parts are denoted by like reference numerals.

DETAILED DESCRIPTION OF THE PREFERRED EMBODIMENT OF THE INVENTION

Figure 3A:
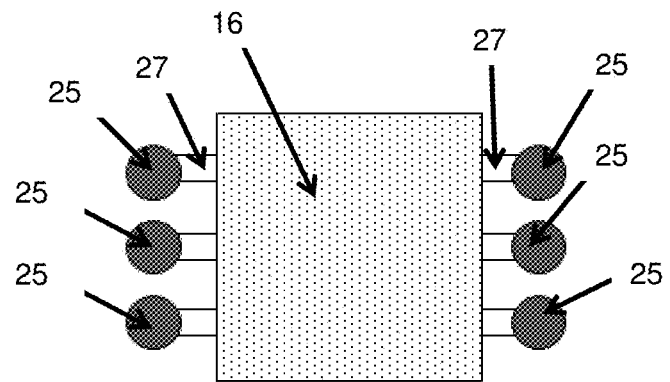
FIGS. 3A-3C are schematic plan views of different possible arrangements of the molding cavity and the plurality of mold supply pots.

FIG. 1 is a schematic sectional view of a molding system according to the preferred embodiment of the invention. The molding system generally comprises first and second mold chases, such as a top mold chase 35 and a bottom mold chase 36 that are movable relative to each other. A substrate 12 including electronic devices mounted thereon to be encapsulated by the molding system is positioned and clamped to a molding cavity 16 for encapsulation, with the electronic devices mounted on the substrate 12 generally being located inside the molding cavity 16. The top mold chase 35 has a top mold chase surface and the bottom mold chase 36 has a bottom mold chase surface opposite to the top mold chase surface, the top and bottom mold chase surfaces being operative to clamp onto the substrate 12 and to apply a clamping pressure thereto. A length of film (not shown) is used to cover the molding surfaces of the top mold chase 35 during encapsulation.

The top mold chase 35 comprises a movable surface in the form of a cavity plate 20 that is adapted to be movable relative to the top mold chase surface. The cavity plate 20 is situated above the film and is covered by the film. The cavity plate 20 is operative to provide a compressive force on the molding compound encapsulating the substrate 12. This is achieved by means of moving the cavity plate 20 between a first position where it forms a first gap with the top surface of the substrate 12 and a second position where it forms a second gap with the substrate 12, where the second gap is smaller than the first gap. The movement of the cavity plate 20 from the first position to the second position compresses molding compound introduced into the molding cavity 16, and shapes the molding compound in the molding cavity 16 to produce an encapsulated semiconductor device. After encapsulation, the encapsulated semiconductor device is separated from the molding cavity 16.

The molding compound is provided in the form of solid pellets to a first mold supply pot 26 and a second supply pot 28 located in the bottom mold chase 36. The mold supply pots 26, 28 receive the solid pellets and supply the molding compound for filling the molding cavity 16. A first plunger 22 located in the first mold supply pot 26 and a second plunger 23 located in the second mold supply pot 28 are operative to crush and liquefy the solid pellets, causing liquefied molding compound 40 located above the plungers 22, 23 to flow out and to be discharged from the respective mold supply pots 26, 28 through runners 27 into the molding cavity 16. Each molding cavity 16 is connected to a plurality of mold supply pots 26, 28, with a runner 27 connecting each mold supply pot 26, 28 to the molding cavity 16.

The runners 27 fluidly connect the mold supply pots 26, 28 to the molding cavity 16. The first mold supply pot 26 is located on a first side of the molding cavity 16 and the second mold supply pot is located on an opposing second side of the molding cavity 16. One advantage of having the molding cavity 16 situated between the two mold supply pots 26, 28 is that the molding compound from each of the mold supply pots 26, 28 need only flow about half the width of the molding cavity 16 in order to fill the molding cavity 16. Another advantage is that the flow of the molding compound into the molding cavity 16 would be more uniform. Hence, the molding system of the present invention is especially useful when employed in large format packaging processes where the molding compound needs to cover a large surface area, such as the whole surface of a wafer, in order to fill the molding cavity 16.

When filling the molding cavity 16 with molding compound, the movable cavity plate 20 may push downwards and compress the molding compound to reduce the gap from the first gap to the second gap. By compressing the molding compound, the cavity plate 20 may push some of the molding compound out of the molding cavity 16 back into the mold supply pots 26, 28. As a result, a thin layer of the molding compound of a thickness corresponding to the second gap may be effectively formed on the top surface of the substrate 12 by means of transfer molding using traditional solid pellets of molding compound.

FIGS. 2A-2C are schematic plan views of the molding cavity 16 and a plurality of mold supply pots 25, showing the progress of the flow of the liquefied molding compound during encapsulation. FIG. 2A shows the arrangement of the circular molding cavity 16 relative to the six mold supply pots 25. Although the molding cavity 16 is circular, for ease of description, it is assumed that the molding cavity 16 conceptually comprises four sides corresponding to the front side, rear side, left side, and right side of the molding system. The six mold supply pots 25 are located on any two opposing sides of the molding cavity 16, with three mold supply pots 25 lined up in a row on one side of the molding cavity 16, and another three mold supply pots 25 lined up in another row located on an opposing side of the molding cavity 16. The molding cavity 16 is situated between the two rows of mold supply pots 25. The runners 27 are distributed symmetrically on opposite sides of the molding cavity 16 along a circumference of the molding cavity 16.

FIG. 2B illustrates how liquefied molding compound 40 flows from the plurality of mold supply pots 25 into the molding cavity 16 during encapsulation. The liquefied molding compound 40 flows at a similar rate from each of the plurality of mold supply pots 25, and hence the liquefied molding compound 40 is shown to have travelled a similar distance from each of the mold supply pots 25. In FIG. 2C, the liquefied molding compound 40 has covered the whole molding cavity 16. It should be appreciated that the molding system of the present invention effectively halves the distance travelled by the liquefied molding compound 40, as compared to a traditional molding system comprising a single mold supply pot located on one side of the molding cavity 16. The shorter flow path of the liquefied molding compound 40 of the molding system of the present invention allows the liquefied molding compound 40 to more effectively and efficiently fill the molding cavity 16, thus resulting in better quality encapsulation for substrates 12. Hence, the molding system of the present invention is able to address common problems related to uneven molding compound flow, such as cosmetic blemish, flow marks, and filler layering.

Figure 3B:
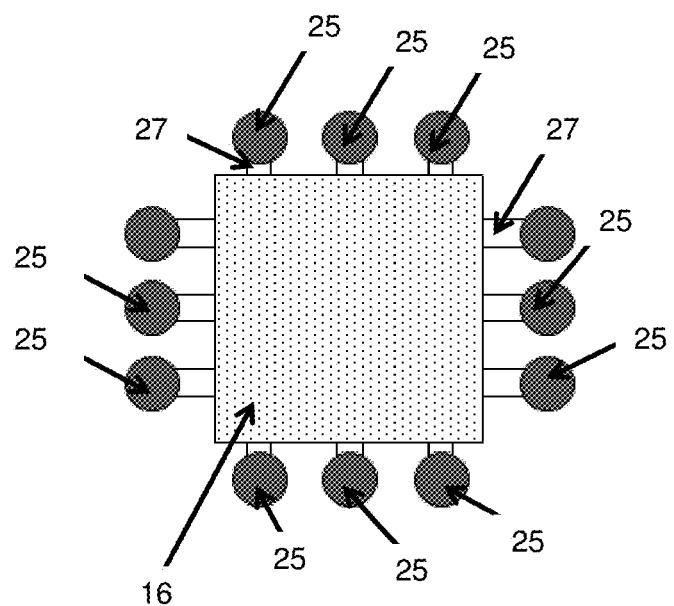
Figure 3C:
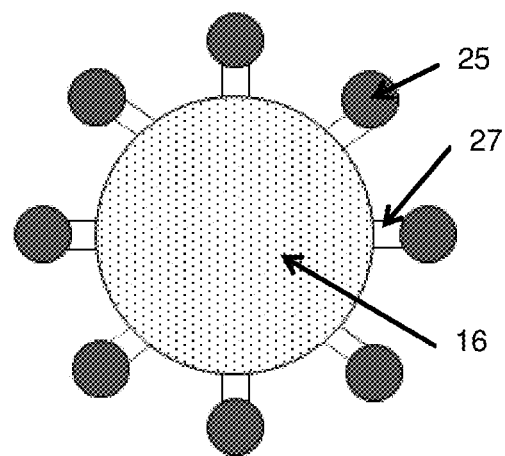

FIGS. 3A-3C are schematic plan views of different possible arrangements of the molding cavity 16 and the plurality of mold supply pots 25, wherein each of the plurality of mold supply pots 25 is spaced at an equal distance from the molding cavity 16 such that each runner 27 has substantially the same length. FIG. 3A shows the molding cavity 16 having a quadrangular shape situated between two rows of mold supply pots 25, each row being on an opposing side of the molding cavity 16. Similarly, FIG. 3B shows the quadrangular shaped molding cavity 16, but in this arrangement, there are four rows of mold supply pots 25 surrounding the molding cavity 16 instead. Each row of mold supply pots 25 is spaced at an equal distance from a respective side of the quadrangular molding cavity 16. In FIG. 3C, the plurality of mold supply pots 25 surround the circular molding cavity 16, each mold supply pot 25 being spaced at an equal distance from the molding cavity 16.

Figure 4A:
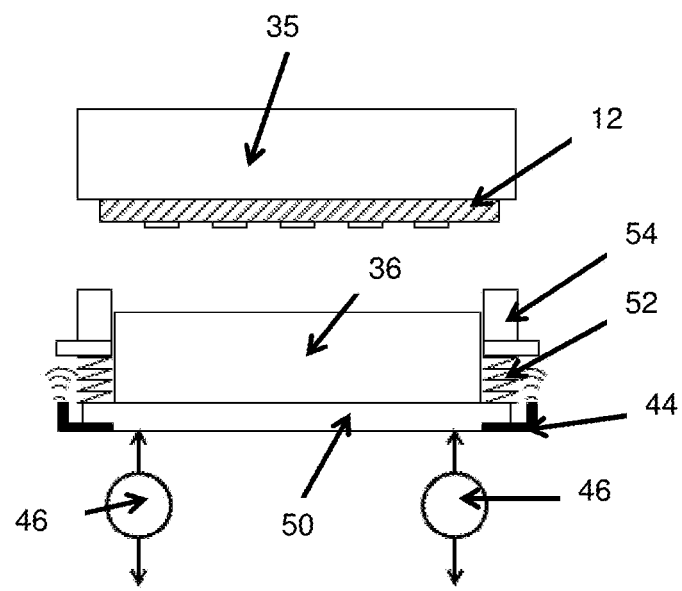
FIGS. 4A-B show the molding system further comprising sensors and actuators for adjusting the relative arrangement between the top mold chase and the bottom mold chase.
Figure 4B:
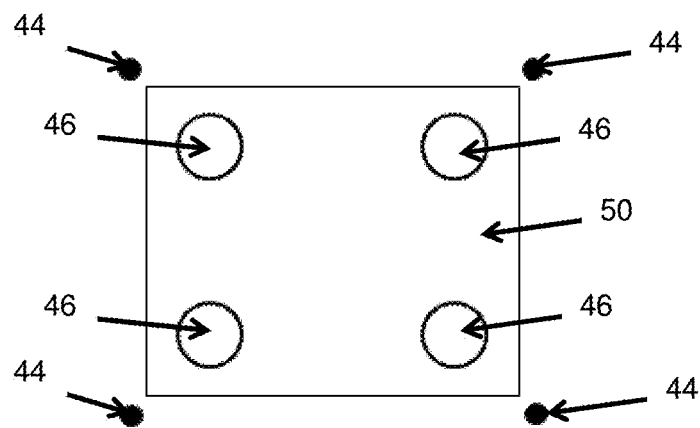

FIGS. 4A-B show the molding system further comprising sensors 44 and actuators 46 for adjusting the relative arrangement between the top mold chase 35 and the bottom mold chase 36. FIG. 4A is a side view and FIG. 4B is a plan view of the molding system comprising the sensors 44 and the actuators 46. Although in this instance, the substrate 12 is shown to be held against the top mold chase 35 in a die-down configuration where the electronic devices are facing downwards, it should be appreciated that the molding system may also be configured to hold the substrate 12 onto the bottom mold chase 36 in a die-up configuration where the electronic devices are facing upwards.

The bottom mold chase 36 is mounted onto a clamping plate 50. A clamping member such as a clamping ring 54 is resiliently mounted adjacent to the top of bottom mold chase surface, and the clamping ring 54 is supported by resilient members, such as springs 52. Thus, the clamping ring 54 may be resiliently mounted to the peripheral edges of the clamping plate 50, adjacent to and surrounding the bottom mold chase 36. Although it is called a ring, it should be appreciated that the clamping ring 54 is not restricted to a circular shape, and it may be in other shapes such as a quadrangular shape. In fact, the clamping ring 54 is preferably designed to be of the same shape as the molding cavity 16 and/or the substrate 12 to be encapsulated. In this case, the molding cavity 16 is in a quadrangular shape, and so the clamping ring 54 is also in a quadrangular shape. The bottom mold chase 36 moves towards the top mold chase 35 until the clamping ring 54 clamps at least partially onto the substrate 12 and the molding cavity 16 is formed. The clamping ring 54 is further adapted to be forcibly movable upon contact with the substrate 12 relative to the top and bottom mold chase surfaces.

Each sensor 44 is located at a different position for determining relative distances between the substrate 12 and a mold chase 35, 36 facing the substrate 12 at different positions. Specifically, a respective position on the clamping ring 54 corresponding to a position on the substrate 12 is detected by each sensor 44.

In FIG. 4B, the bottom mold chase 36 and the clamping plate 50 of the bottom mold chase 36 are both quadrangular in shape. The sensors 44 are mounted at four corners of the clamping plate 50 adjacent to corresponding corners of the bottom mold chase surface. The sensors 44 are operative to detect a distance of the clamping ring 54 relative to the clamping plate 50 of the bottom mold chase 36. Hence, when the clamping ring 54 clamps onto the substrate 12, the springs 52 would be compressed and the clamping ring 54 would move nearer to the clamping plate 50 when the clamping plate 50 further moves towards the substrate 12 to compress the molding cavity 16. Each sensor 44 detects such relative distance between the clamping ring 54 and the sensor 44 mounted on the clamping plate 50. The actuators 46 are coupled to the clamping plate 50 and are located adjacent to the positions of the respective sensors 44. They are also near to the four corners of the clamping plate 50. Each actuator 46 is operative to move a portion of the bottom mold chase 36, such as the respective corner of the clamping plate 50, up or down towards or away from a corresponding portion of the top mold chase 35 to adjust the relative distances between the sensors 44 and clamping ring 54 at each position of the sensors 44, for applying a uniform clamping pressure onto the substrate 12. In particular, the clamping pressure would be more uniform when the relative distances are adjusted to be substantially the same.

Figure 5A:
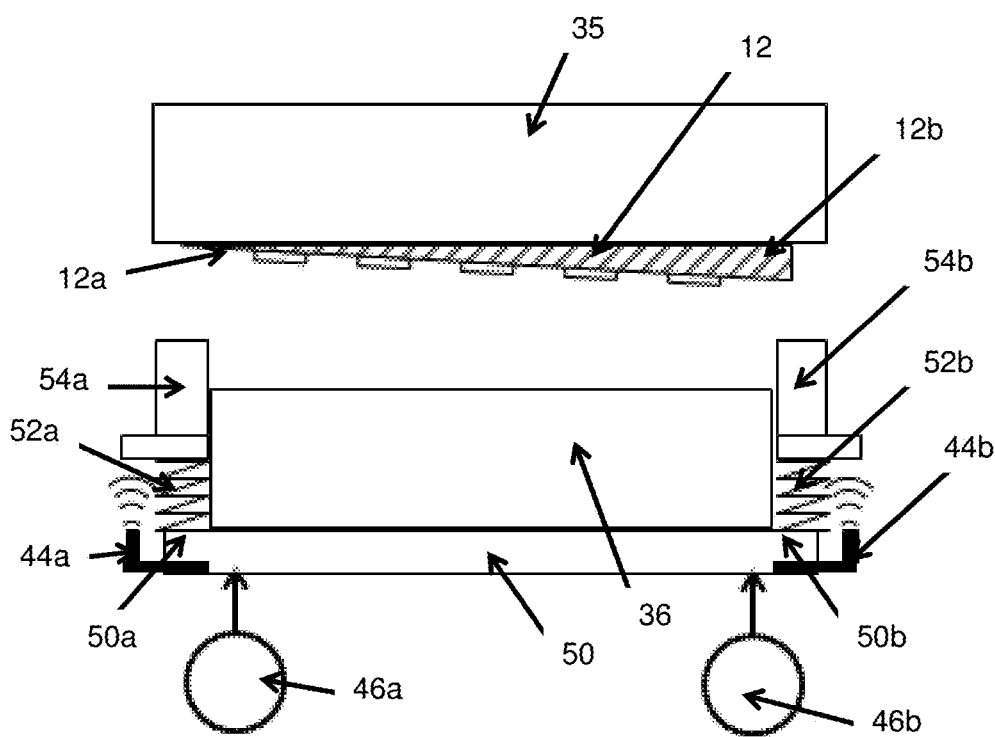
FIGS. 5A-B are side views of the molding system before and after the molding system clamps onto a substrate having an uneven thickness.
Figure 5B:
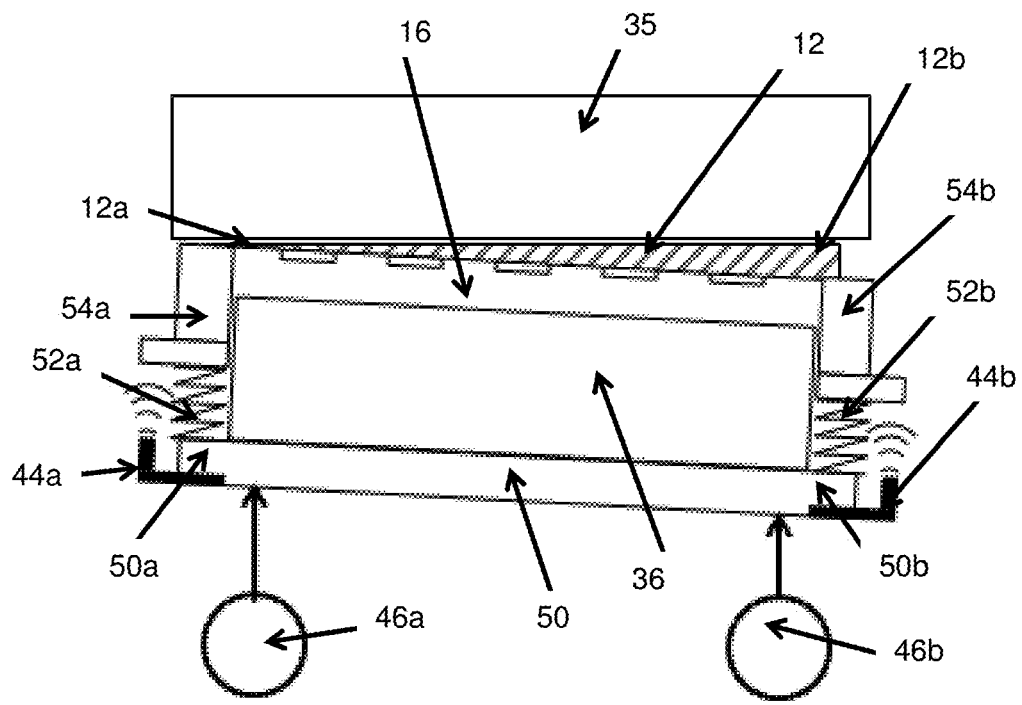

FIGS. 5A-B are side views of the molding system before and after the molding system clamps onto a substrate 12 having an uneven thickness. For illustration purposes, the unevenness in the substrate 12 has been exaggerated. In FIG. 5A, the substrate 12 with the uneven thickness is held onto the top mold chase 35. During encapsulation, the clamping plate 50 and the bottom mold chase 36 move relative to the top mold chase 35 until the clamping ring 54 clamps onto the substrate 12. Since the substrate 12 is thicker at a right end 12$b$ than at a left end 12$a$ thereof, a spring 52$b$ supporting a right end 54$b$ of the clamping ring 54 would be compressed more than a spring 52$a$ supporting the left end 54$a$ of the clamping ring 54. The amount of compression of each of the springs 52$a$, 52$b$ is detected by a respective sensor 44$a$, 44$b$.

The molding system receives feedback from the sensors 44$a$, 44$b$ and activates a left actuator 46$a$ and a right actuator 46$b$ to adjust the relative arrangement of the mold chases 35, 36 such that the surface of the substrate 12 to be molded is substantially parallel to the surface of the molding cavity 16 opposite the surface of the substrate 12. Therefore, each actuator 46 adjusts a respective relative distance to tilt the top or bottom mold chase surface relative to the substrate 12 so that the relative distances are substantially the same and the surface of the substrate 12 is parallel to the mold chase surface that is facing it. This helps to ensure that a gap between the surface of the substrate 12 and the surface of molding cavity 16 clamping onto the surface of the substrate 12 is within a predetermined range. In the scenario illustrated in FIG. 5B, the left actuator 46$a$ pushes a left end 50$a$ of the clamping plate 50 upwards while the right actuator 46$b$ may correspondingly pull a right end 50$b$ of the clamping plate 50 downwards. The actuators 46$a$, 46$b$ adjust the alignment of the clamping plate 50 until the springs 52$a$, 52$b$ are compressed by substantially the same distance, as illustrated in FIG. 5B. Thus, the molding system may compensate for any unevenness on the surface of the substrate 12 and/or any differences in thickness across the whole substrate 12, so as to contribute to a uniform clamping force throughout the whole of the substrate 12.

Thereafter, molding compound is introduced into the molding cavity 16 as has been described above in relation to FIG. 1. As the molding compound fills the molding cavity 16, the molding compound flowing into the molding cavity 16 exerts pressure onto the mold chases 35, 36. The pressure exerted by the molding compound may cause the gap between the top surface of the bottom mold chase 36 and the surface of the substrate 12 to widen and/or the relative arrangement of the mold chases 35, 36 to change. Any changes in the size of the gap and/or the relative arrangement of the mold chases 35, 36, are detected by the sensors 44 and compensated for by the actuators 46 adjusting the alignment of the clamping plate 50 accordingly. The sensors 44 and the actuators 46 perform the monitoring and compensation continuously as the encapsulation process is being conducted until the molding compound has solidified and has been cured. Thereafter, the encapsulated semiconductor device is separated from the molding cavity 16.

Figure 6:
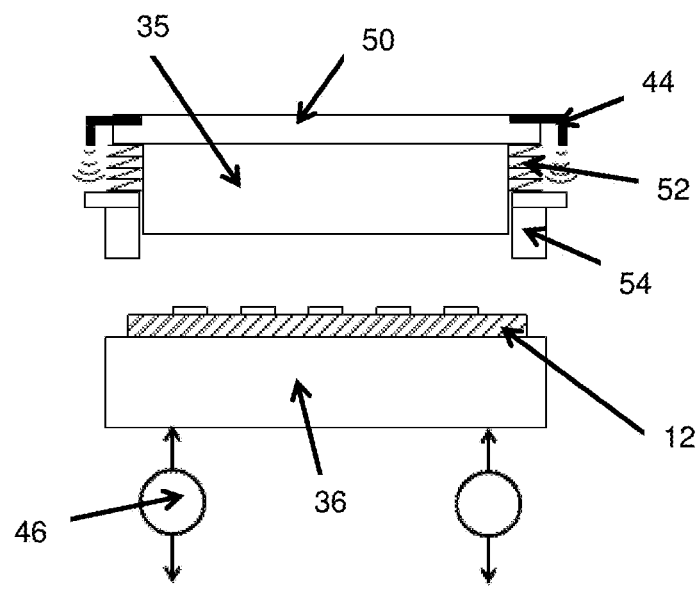
FIG. 6 shows a side view of an alternative arrangement of the sensors, where the sensors are coupled to the top mold chase.

FIG. 6 shows a side view of an alternative arrangement of the sensors 44, where the sensors 44 are mounted to the top mold chase 35. The clamping plate 50 is also coupled to the top mold chase 35. The sensors 44 are mounted onto the clamping plate 50, and the clamping ring 54 is resiliently mounted to the clamping plate 50 via the springs 52. The substrate 12 is held onto the bottom mold chase 36 in a die-up configuration. In this configuration, the actuators 46 are coupled to the bottom mold chase 36.

Although the present invention has been described in considerable detail with reference to certain embodiments, other embodiments are possible.

For example, instead of the four sensors 44 and actuators 46, the molding system may comprise any other number of sensors 44 and actuators 46 to achieve different degrees of control. The sensors 44 may also be any appropriate type of sensor for determining a gap, such as an optical beam sensor or proximity sensor.

The sensors 44 and the actuators 46 may be mounted in any other configuration, for example the actuators 46 may be mounted onto the top mold chase 35 even when the sensors 44 are located on the clamping plate 50 coupled to the bottom mold chase 36.

In addition, instead of the molding cavity 16 being circular or comprising four sides, the molding cavity 16 may be of any other shapes or comprise any other number of sides.

Furthermore, instead of solid pellets, the molding system of the present invention may also be configured to accept liquid molding compound.

Therefore, the spirit and scope of the appended claims should not be limited to the description of the embodiments contained herein.

The invention claimed is:

1. A molding system for encapsulating electronic devices mounted on a substrate, the molding system comprising:
   a first mold chase;
   a clamping member having a first clamping surface which is adjacent to and surrounding the first mold chase, the clamping member being forced by the substrate to resiliently move with respect to the first mold chase upon contact with the substrate;
   a second mold chase with a second mold chase surface opposite to the first clamping surface, the first clamping surface and second mold chase surface being operative to clamp onto the substrate and to apply a clamping pressure thereto;
   a first sensor located at a first position which determines a first relative distance between the first sensor and the first clamping surface facing the substrate at the first position when the first clamping surface is exerting a force onto the substrate after the first clamping surface adjacent to the first position has been resiliently moved by the substrate with respect to the first mold chase;
   a second sensor located at a second position which determines a second relative distance between the second sensor and the first clamping surface facing the substrate at the second position when the first clamping surface is exerting a force onto the substrate after the first clamping surface adjacent to the second position has been resiliently moved by the substrate with respect to the first mold chase; and
   a first actuator which is located adjacent to the first position, and a second actuator which is located adjacent to the second position,
   wherein the first and second actuators are operative to adjust a planarity of the first clamping surface relative to the second mold chase surface by changing the first relative distance with respect to the second relative distance such that the first and second relative distances are substantially the same and the first clamping surface clamping the substrate applies uniform clamping pressure onto the substrate.

2. The molding system as claimed in claim 1, wherein each of the sensors is operative to detect a distance between a respective position on the clamping member and the sensor.

3. The molding system as claimed in claim 1, wherein the first and second mold chases are quadrangular in shape, and the molding system comprises:
   a total of four sensors, each sensor being located adjacent to a corner of the first clamping surface or the second mold chase surface.

4. The molding system as claimed in claim 2, wherein the molding system further comprises a total of four actuators, each actuator being located adjacent to a respective sensor.

5. The molding system as claimed in claim 1, wherein the first and second sensors are resiliently mounted onto a clamping plate that is configured to be movable towards the substrate to compress a molding cavity when the first clamping surface and second mold chase surface clamp onto the substrate.

6. The molding system as claimed in claim 4, wherein the first and second actuators are coupled to the clamping plate.

7. The molding system as claimed in claim 4, wherein the clamping plate is coupled to the first mold chase, and the first and second actuators are coupled to the second mold chase.

8. The molding system as claimed in claim 1, wherein each actuator is operative to move a portion of one mold chase towards or away from a corresponding portion of the other mold chase.

9. The molding system as claimed in claim 1, wherein each actuator is operative to adjust the first or second relative distance to tilt a first mold chase surface or the second mold chase surface relative to the substrate so that the first and second relative distances are the same, and the surface of the substrate is parallel to the mold chase surface that is facing it.

10. The molding system as claimed in claim 1, further comprising:
    one or more molding cavities in the first and/or second mold chase, and
    a plurality of runners connecting the molding cavity to a plurality of mold supply pots.

11. The molding system as claimed in claim 9, wherein each molding cavity is situated between at least two mold supply pots and a separate runner connects each mold supply pot to the molding cavity.

12. The molding system as claimed in claim 9, wherein each of the plurality of runners has substantially the same length.

13. The molding system as claimed in claim 10, wherein the molding cavity is circular in shape, and the plurality of runners is distributed symmetrically on opposite sides of the molding cavity along a circumference thereof.

* * * * *